United States Patent [19]

Boleda et al.

[11] 4,216,544
[45] Aug. 5, 1980

[54] DIGITAL CLOCK RECOVERY CIRCUIT

[75] Inventors: Alberto Boleda, Menlo Park; John F. Wakerly, Palo Alto, both of Calif.

[73] Assignee: Northern Telecom Limited, Montreal, Canada

[21] Appl. No.: 943,744

[22] Filed: Sep. 19, 1978

[51] Int. Cl.² .................. H04L 7/02; H04L 25/40
[52] U.S. Cl. ........................ 375/119; 328/55; 328/133; 235/92 MS
[58] Field of Search .......... 328/39, 55, 133; 340/168 R, 147 SY; 178/69.1; 179/15 BS; 235/92 R, 92 MS

[56] References Cited

U.S. PATENT DOCUMENTS

| | | | |
|---|---|---|---|
| 3,102,164 | 8/1963 | Rolz | 178/69.1 |
| 3,112,363 | 11/1963 | Schramel et al. | 178/69.1 |
| 3,363,183 | 1/1968 | Bowling et al. | 328/63 |
| 4,036,431 | 7/1977 | Gidlof | 235/92 MS |

*Primary Examiner*—Benedict V. Safourek
*Attorney, Agent, or Firm*—Spencer & Kaye

[57] ABSTRACT

A digital clock recovery circuit in which the phase of the divider chain driven by a local clock is controlled in order to maintain its output (the recovered clock signal) in synchronization with the incoming data stream. Additional control circuitry is included to inhibit phase correction when the relative phase of the two signals is within certain limits. Also phase correction takes place only after several indications one signal is leading or lagging the other, to prevent any correction due to noise.

6 Claims, 3 Drawing Figures

DIGITAL CLOCK RECOVERY CIRCUIT

This invention relates to a clock recovery circuit and more particularly to one which is implemented utilizing digital techniques.

BACKGROUND OF THE INVENTION

In the transmission of digital signals from a master to a slave station (e.g. a main terminal to a remote subterminal) it is often necessary to recover the clock signal directly from the incoming data as well as provide a clock source for data being transmitted back to the main terminal. A traditional circuit for recovering the clock signal in such an application uses a resonant LC oscillator incorporating an analog phase-locked loop to synchronize it with the incoming pulse stream.

With the widescale adoption of large scale integration for digital transmission, it is desirable to implement the clock recovery circuit utilizing digital phase-locking techniques. One example of such a circuit is disclosed in U.S. Pat. No. 3,484,555, by W. K. L. Ching et al, issued Dec. 16, 1969. Here, a high-frequency clock is used to drive a frequency divider, the output of which is a recovered clock signal whose frequency is equal to the pulse repetition rate of the incoming data stream. The number of pulses from the clock is augmented in order to maintain the phase and frequency of the recovered clock in step with the received data signal. The circuit arrangement is such that even when the frequency of the recovered clock signal is exactly equal to that of the data stream, phase corrections which alternately advance or retard the phase of the signal relative to the data stream, continue to take place. In addition to this, the circuit is such that it responds to each detected transition of the input signal, the result of which is that spurious noise on the incoming data stream may be detected as a transition and cause erroneous phase shift of the recovered clock signal.

STATEMENT OF THE INVENTION

The present invention provides a novel digital phase-locking clock recovery circuit which overcomes the disadvantages of the prior art circuit. To prevent unwanted phase shift of the recovered clock signal, the present invention utilizes a window blocking interval, during which no phase corrections take place. Hence phase correction by augmenting the number of pulses from the local clock takes place only when the relative phase of the two signals (i.e. the recovered clock signal and the received digital signal) falls outside this interval.

Thus, in accordance with the present invention there is provided a clock recovery circuit for a digital transmission system which basically comprises a local clock having a nominal repetition rate greater than the pulse rate of the received digital signal. The recovery circuit also includes a divider circuit which is responsive to the local clock and a gating circuit to provide a recovered clock signal at its output. Since the local clock is free-running relative to the received digital signal, additional circuitry is required to maintain phase and frequency synchronization between the received digital signal and the recovered clock. To achieve this, the clock recovery circuit also includes the gating circuit which is responsive to the relative phase of the recovered clock signal and a detected transition of the received digital signal for generating control signals which advance or delay the divider, so that the average frequency of the recovered clock signal is equal to that of the received digital signal although the instantaneous phase may vary between controlled limits. To prevent further correction when the relative phase difference is between these set limits, the recovery circuit additionally contains a further gating circuit responsive to a particular output from a divider chain (counter) for deriving the recovered clock signal, for overriding the control circuitry to inhibit the advancing or retarding of the divider.

In a particular embodiment, the local clock has a nominal frequency equal to N times that of the received digital signal. The divider consists of a sequential circuit which produces a controlled clock signal whose average frequency equals N/2 times the received digital signal frequency. A modulo-N/2 counter which is driven by the controlled clock signal, generates the recovered clock signal at the output of its most significant bit (MSB). Here, the further gating circuit provides a gating signal for each non-coincidence between a selected output count from the counter and the detected transition of the received digital signal. A control circuit which is responsive only when the gating signal is present advances or delays the controlled clock signal depending on whether the phase of the detected transition leads or lags respectively, that of the recovered clock signal.

In order to substantially eliminate unwanted phase corrections due to noise on the incoming data stream, the present invention may also include additional circuitry which requires at least several indications that the detected transition of the incoming digital signal either leads or lags the output of the counter before any phase correction takes place. This results in a clock recovery circuit which is relatively immune to short bursts of noise and pattern-dependent jitter in the incoming data stream. To achieve this, the recovery circuit additionally includes an up/down counter which counts up or down in response to the presence or absence respectively of the recovered clock signal, each time the counter is enabled by the gating signal. In addition, the recovery circuit includes a decoding network responsive to the detection of a selected up or down count stored in the counter for providing control signals, for respectively advancing or retarding the controlled clock signal and hence the recovered clock signal. After each phase correction, the up/down counter is reset and the cycle is repeated.

In order to prevent advancing or retarding of the recovered clock signal when such corrections are undesirable for external circuits receiving it, the invention may also provide an input control signal that prevents such corrections from taking place until such time that they may be acceptable to the external circuits.

BRIEF DESCRIPTION OF THE DRAWINGS

An example embodiment of the invention will now be described with reference to the accompanying drawings in which.

DESCRIPTION OF THE PREFERRED EMBODIMENT

Figure 1:
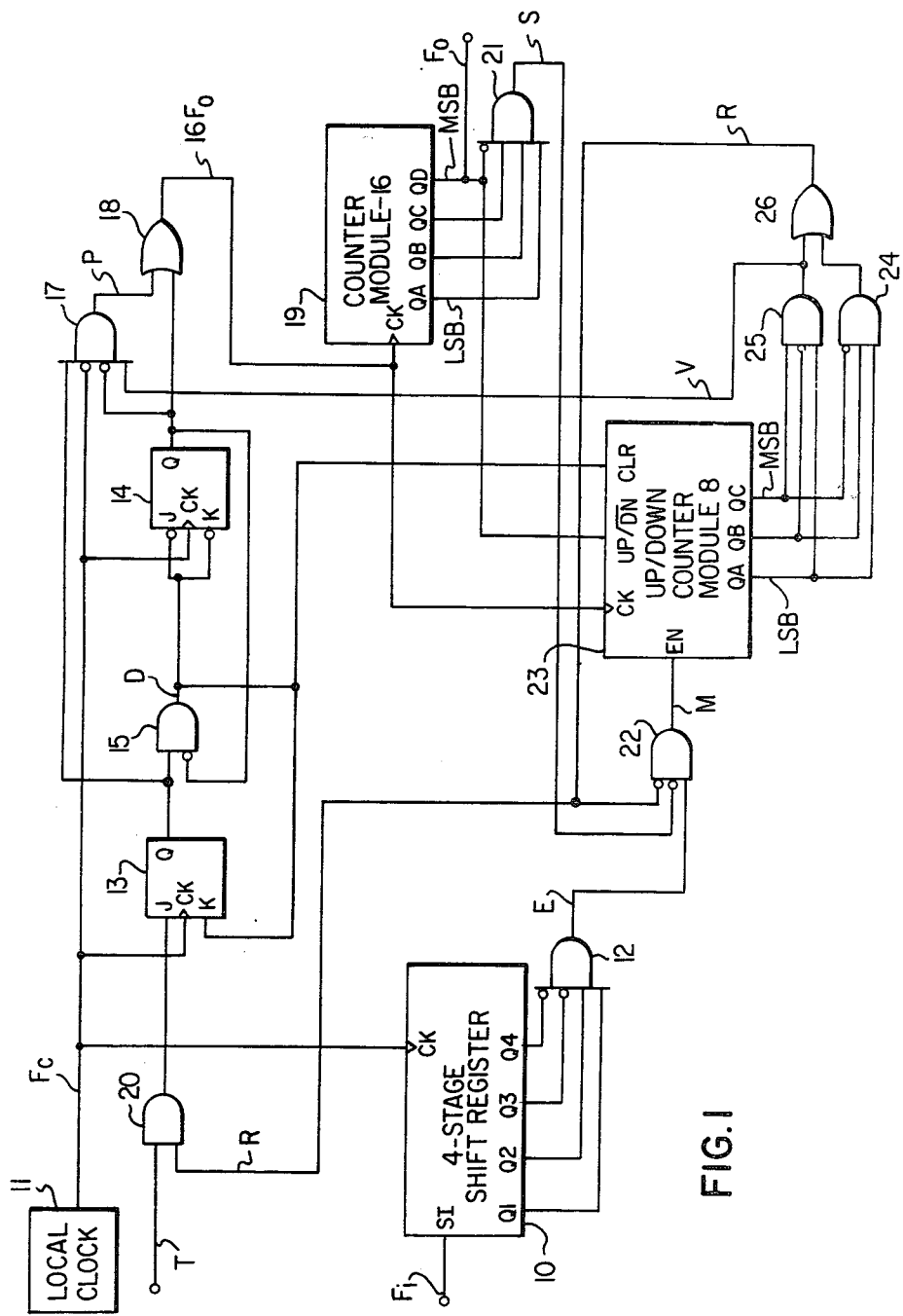
FIG. 1 is a schematic circuit diagram of a clock recovery circuit for a digital transmission system.

Referring to FIG. 1, the received digital input signal $F_i$ to the clock recovery circuit is a return-to-zero (RZ)

binary input data stream coupled in a well known manner from a transmission line. To suppress spurious noise pulses on the incoming data stream, the received digital signal $F_i$ is coupled to the serial input (SI) of a 4-stage shift register 10, which is stepped by the output signal $F_c$ of a local clock 11 having a nominal frequency N times that of the received digital signal, i.e. $F_c \approx NF_i$. In a practical embodiment N is usually selected to be about 10 or greater in order to limit excessive jitter on the recovered clock signal, and in the present case N=32. When a pulse is present at the serial input SI, a 1 is loaded into the register 10 during each cycle of the clock signal $F_c$; otherwise a 0 is entered. The output of each of the four stages is decoded by an AND gate 12 having two inverting inputs. Gate 12 provides a control signal E at its output only when the input sequence is 0 for two $F_c$ pulses followed by 1 for two $F_c$ pulses to recognize a positive transition of the signal $F_i$. As a result, a positive going transition in signal $F_i$ is detected by the shift register state 1100, which provides a high degree of certainty that a legitimate pulse has been received.

The output of the clock 11 is also used to clock two positive-edge-triggered J-K flip-flops 13 and 14, which with gates 15, 17 and 18 form a sequential circuit, whose output is a clock controlled signal 16 $F_o$. The 16 $F_o$ signal is used to clock a modulo-16 counter 19 functioning as a divider whose MSB output is a recovered clock signal $F_o$.

The balance of the clock recovery circuitry is used to control the phase of the clock controlled signal 16 $F_o$ so that its average frequency will be exactly 16 times that of $F_i$, whereby the average frequency of the recovered clock $F_o$ will be equal to that of $F_i$, and the phase difference between signals $F_o$ and $F_i$ will remain within prescribed limits. This circuitry includes an AND gate 20 so that phase adjustment takes place only when an adjustment is requested by an adjust control signal R from circuitry explained later, and simultaneously an input control signal T=1 indicating that an adjustment is allowed by other external circuitry (not shown).

The J-K flip-flop 14 normally forms a divide-by-two counter, as it will normally toggle each clock cycle of $F_c$, due to the inverted J-K inputs when D=0. When an adjustment is requested R=1 and allowed T=1, the request is decoded by AND gate 20 and stored in J-K flip-flop 13. The adjustment will be made by inhibiting the toggling of flip-flop 14 for one cycle of the local clock $F_c$. The AND gate 15 is used to produce the toggle control signal D performing the adjustment only when the Q output of flip-flop 14 is 0. The signal D also clears the adjustment request by means of the K input of flip-flop 13, and inhibits the toggling of flip-flop 14 for the one cycle of $F_c$ that D=1. The clock controlled signal 16 $F_o$ is obtained from the OR gate 18.

Figure 2:
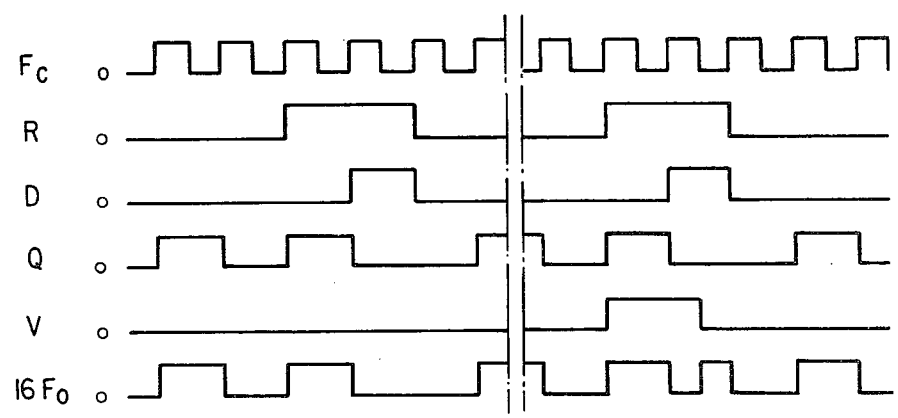
FIGS. 2 and 3 are typical pulse waveforms generated by the circuit of FIG. 1.

FIG. 2 illustrates some typical pulse waveforms developed at various points in the circuit of FIG. 1. The left-hand side of FIG. 2 shows the delayed output of the signal 16 $F_o$ from the OR gate 18 generated by the J-K flip-flop 14 due to the presence of the D signal. The above sequence will occur if the control signal V=0 at the input to AND gate 17, so that the signal 16 $F_o$ follows the output of flip-flop 14, thereby retarding the signal 16 $F_o$ by one period of $F_c$. On the other hand, if both signals R=V=1, then a signal P is generated by the gate 17 when $F_c$=0 adding a pulse and having the effect of advancing signal 16 $F_o$ by one period of $F_c$. This is illustrated in detail on the right-hand side of FIG. 2.

The R and V control signals are obtained from the balance of the control circuitry in the following manner. When the phase of the signal $F_o$ is in its normal operating range, the detected transition signal E will occur during state 0111 (N/4−1) of the counter 19. This state occurs just before the MSB at output QD of the counter 19 is about to change state from 0 to 1, and is decoded by the AND gate 21 to produce a selected output count signal S. If the E signal occurs at any other time, providing a R signal is not present, a gating signal M from an AND gate 22 is coupled to the enable input (EN) of an up/down counter 23. The counter 23 then counts up one count if $F_o$=1 (indicating the recovered clock leads the received digital signal) and down one count if $F_o$=0 (indicating the recovered clock lags the received digital signal). The normal state of the three outputs QC, QB, QA of the up/down counter 23 is 000. If the outputs reach a state 011 (+3) or 101 (−3), an output is obtained from either decoding AND gate 24 or 25. The output from AND gate 25 provides the advance control signal V which is applied directly to the AND gate 17 to add a pulse to the clock controlled signal 16 $F_o$. Both AND gates 24, 25 are coupled to separate inputs of an OR gate 26, which provides the adjust control output R which is used to control AND gate 20.

Figure 3:
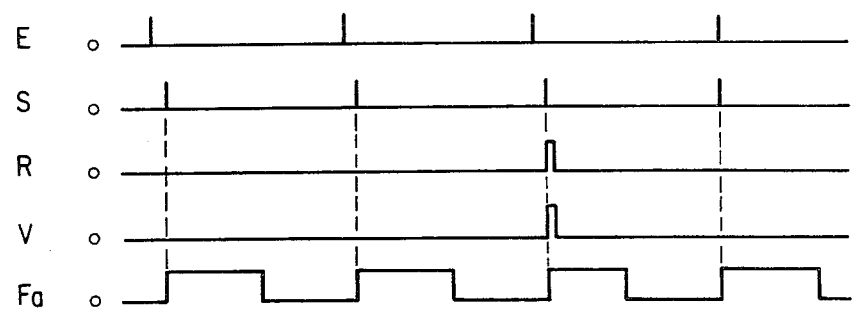

FIG. 3 illustrates some typical waveforms which occur when an additional pulse is added (as shown on the right side of FIG. 2) to the clock controlled signal 16 $F_o$, to advance the phase of the recovered clock signal $F_o$ relative to the detected transition signal E which is derived from the incoming digital signal $F_i$. The phase shift of $F_o$ is exaggerated somewhat in order that the effect will be clear. In addition to its previously described function, the toggle control signal D is used to synchronously clear (CLR) the up/down counter 23 to 000, which must then accumulate additional error signals before further adjustments take place.

Thus, during operation, if the recovered clock signal $F_o$ leads the incoming digital signal $F_i$ three more times than it lags it over a period of time, the up/down counter 23 will reach a state 011. This is decoded by the AND gate 24 which results in signals V=0 and R=1, thereby inhibiting the toggling of flip-flop 14 for one $F_c$ clock period and slowing down the 16 $F_o$ signal and in turn the $F_o$ signal. Likewise, if $F_o$ lags $F_i$ three more times than it leads it, the up/down counter 23 will reach a state 101. This is decoded by the AND gate 25 resulting in V=1 and R=1 thereby inserting a pulse in signal 16 $F_o$ thereby advancing it one $F_c$ clock period, and in turn $F_o$. After either adjustment, the up/down counter 23 is reset to 000 by the output from the AND gate 15 which is fed to the CLR input. The use of the up/down counter 23 provides integration or "smoothing" by allowing the occurrence of early incoming transitions of $F_i$ to be balanced by later ones. Only if the transitions are consistently late or early does an adjustment take place. Thus, the clock recovery circuit can filter a certain amount of jitter in the incoming signal $F_o$ so that the jitter in the recovered clock signal $F_o$ is limited to its inherent jitter. Increasing the required count from the up/down counter 23 before an adjustment takes place will allow a greater amount of jitter on the input signal to be smoothed but will reduce the capture and lock range of the overall clock recovery circuit. The inherent jitter of the recovered clock signal $F_o$ is the time difference between the actual occurrence of its leading edge and the ideal occurrence of it. The inherent jitter varies inversely as the value N, thus N=32 would provide a jitter of 1/32 or about 3%.

Ideally, a clock recovery circuit should produce $F_o$ with no jitter. In the present case the inherent jitter is equal to the period of the local clock $F_c$, since the finest adjustment which can be made to $F_o$ is to advance or retard it by one period of $F_c$. While larger values of N will reduce the inherent jitter, they will require a higher speed local clock and overall clock recovery circuit.

What is claimed is:

1. A clock recovery circuit for a digital transmission system, comprising:
   a local clock having a nominal repetition rate greater than the pulse rate of a received digital signal;
   a divider circuit responsive to the local clock and a gating circuit for providing a recovered clock signal at its output;
   the gating circuit detecting the relative phase of the recovered clock signal and a detected transition of the received digital signal for generating control signals which advance or delay the divider circuit to maintain the average repetition rate of the recovered clock signal equal to said pulse rate of the received digital signal;
   characterized by:
   a further gating circuit responsive to a selected output count from the divider circuit for inhibiting said gating circuit to prevent said advance or delay of the divider circuit during the interval of said selected output count.

2. A clock recovery circuit as defined in claim 1 in which the divider circuit comprises:
   a sequential circuit for toggling the local clock signal to generate a clock controlled signal; and a divider counter for counting the clock controlled signal to derive the recovered signal directly therefrom at a selected sub-multiple frequency thereof; and
   the further gating circuit being responsive to the non-coincidence of the selected output count from the counter and the detected transition of the received digital signal to enable control circuitry for initiating an additional toggle or inhibiting a toggle in the sequential circuit to insert the phase of the clock controlled signal so as to advance or retard the divider circuit by one clock period of the local clock.

3. A clock recovery circuit as defined in claim 2 which additionally comprises:
   an up/down counter responsive to the presence or adsence of a pulse of the recovered clock signal to count up or down respectively when said up/down counter is enabled by the further gating circuit signal;
   decoding means for providing an output control signal in response to a selected up or down count stored in the up/down counter, for respectively advancing or delaying the phase of the clock controlled signal fed to the divider counter.

4. A clock recovery circuit as defined in claim 3 which also includes circuitry for resetting the up/down counter after the phase of the clock controlled signal has been advanced or delayed.

5. A clock recovery circuit as defined in claim 1 additionally comprising a still further gating circuit responsive to an external enabling signal for actuating the control circuit to prevent said advance or delay of the divider circuit, only during the presence of said enabling signal.

6. A clock recovery circuit for a digital transmission system, comprising:
   a local clock having a nominal repetition rate greater than the pulse rate of a received digital signal;
   a divider circuit responsive to the local clock and a gating circuit for providing a recovered clock signal at its output; the gating circuit detecting the relative phase of the recovered clock signal and a detected transition of the received digital signal for generating control signals which advance or delay the divider circuit to maintain the average repetition rate of the recovered clock signal equal to said pulse rate of the received digital signal;
   characterized by:
   an up/down counter responsive to the presence or absence of a pulse of the recovered clock signal to count up or down respectively;
   decoding means for providing output control signals in response to a selected up or down count stored in the up/down counter to enable the gating circuit for initiating the advancing or delaying of the signals in the divider circuit.

* * * * *